(12) United States Patent
Lin et al.

(10) Patent No.: US 6,342,670 B1
(45) Date of Patent: Jan. 29, 2002

(54) PHOTOELECTRIC MODULE DEVICE

(75) Inventors: Ching Kai Lin; Hsu Keng Tseng, both of Taipei (TW)

(73) Assignee: Lite-On Electronics, Inc., Taipei (TW)

( * ) Notice: Subject to any disclaimer, the term of this patent is extended or adjusted under 35 U.S.C. 154(b) by 0 days.

(21) Appl. No.: 09/664,780

(22) Filed: Sep. 19, 2000

(51) Int. Cl.⁷ .................. H01L 31/048; H01L 31/05; H01L 31/0224; H01L 31/0203

(52) U.S. Cl. .................. 136/251; 136/244; 136/256; 136/293; 257/79; 257/431; 257/443; 257/433; 250/216; 250/239; 438/64; 438/66; 438/127; 438/107; 428/901; 362/800

(58) Field of Search ................ 136/244, 256, 136/293, 251; 257/79, 431, 443, 433; 250/216, 239; 438/64, 66, 127, 107; 428/901; 362/800

(56) References Cited

FOREIGN PATENT DOCUMENTS

JP          9-293901      * 11/1997

* cited by examiner

*Primary Examiner*—Alan Diamond
(74) *Attorney, Agent, or Firm*—Rosenberg, Klein & Lee

(57) ABSTRACT

A photoelectric module device comprising a multiple layer printed circuit board and at least one photoelectric module device is provided. The multiple layer printed circuit board has at least an upper circuit board substrate, a lower circuit board substrate, and a circuit. A plurality of photoelectric elements are installed on the multiple layer printed circuit board and is electrically connected to the circuit. The photoelectric elements are packaged above the multiple layer printed circuit board by injection molding a transparent resin thereon. The lower substrate has a plurality of through holes formed therein and the inner wall of the through holes is plated with metal, as an electric terminal. The upper circuit board substrate serves to seal the through holes and prevent resin from permeating therein during the injection molding process. When the circuit board is cut into separate photoelectric module devices, after packaging, the inner wall of the through holes are partially cut away and the remaining portion thereof becomes a terminal for electrically connecting to external devices.

6 Claims, 8 Drawing Sheets

PHOTOELECTRIC MODULE DEVICE

FIELD OF THE INVENTION

The present invention relates to a photoelectric module device, and especially to a photoelectric module device that overcomes the prior art problem of the packaging material of the photoelectric module device permeating into the terminal holes of the substrate.

BACKGROUND OF THE INVENTION

In a prior art photoelectric module device, for example, an infrared data transmission module (IrDA), a light emitting diode, a charge coupled device (CCD), etc., an electrically connected terminal (welding point) protrudes out from a lateral side, and therefore the device has a large volume. However, the compact design of electronic products is a current trend. For example, in an infrared data transmission module, in order to reduce the volume, an encapsulating method is used in packaging. However, such a method is likely to induce poor positioning of the chip in the module. For example, in the process of packaging, the buoyancy force due to the liquid resin will induce the photoelectric module device chip to shift its position away from the center of an optical axis, so that the yield ratio for manufacturing the devices will decrease.

In order to correct the above discussed problem, another prior art infrared data transmission module 700 has been disclosed. Referring to the design of FIG. 6, a lower circuit board 70 is provided with a solder mask 72 for preventing resin from being filled into the terminal holes 71 during encapsulating. Furthermore, the photoelectric module device chip 76 is installed on the circuit board 70 and an electric connection is formed therebetween. Then a packaging layer 74 is formed by injection molding. Although this prior art system uses a solder mask 72 to prevent resin from filling into the terminal holes 71, it cannot sustain the high temperature and high pressure of injection molding. As a result, the solder mask 72 often breaks during injection molding, so that resin flows into the terminal holes 71, and thus, the product is ineffective and the yield ratio is reduced.

FIG. 7 shows a perspective view of a prior art LED chip 800 which has a plurality of terminal holes 81 extending from the lower layer circuit board 80 and the upper package layer 84. FIG. 8 is a perspective view of a prior art charge coupled device 900 (CCD) which has a plurality of terminals 91 and an upper packing layer 94. A charge coupled device chip 97 is on a lower substrate 90. The chip 97 is connected to the inner legs of the terminals 91 through respective conductive wires 95. The defects of these products is the same as the above product, i.e., the terminal holes 81 and terminals 91 of the lower circuit board 80 and substrate 90 protrude from a respective lateral side thereof, so that the volume of the products are large and cannot be reduced.

SUMMARY OF THE INVENTION

Accordingly, the primary object of the present invention is to provide a photoelectric module device that resolves the prior art problem of the packaging material of the photoelectric module device permeating into the terminal holes and further to improve the manufacturing yield ratio for the device.

Another object of the present invention is to provide a photoelectric module device that resolves the prior art problem of the photoelectric module device having an overly large volume.

Still another object of the present invention is to provide a photoelectric module device which has a simple packaging process and thus lowers the cost thereof.

In order to achieve above and other objects, the present invention provides a photoelectric module device comprising a multiple layer printed circuit board and at least one photoelectric element, such as a light emitting diode chip, photo diode chip, phototransistor chip, charge coupled device chip, etc. The multiple layer printed circuit board has at least an upper circuit board substrate, a lower circuit board substrate, and a circuit. The photoelectric element is installed on the multiple layer printed circuit board and is electrically connected to the circuit. By injection molding a transparent resin, the photoelectric element is packaged above the multiple layer printed circuit board. The lateral surface of the lower circuit board has a plurality of terminals which are electrically connected to the circuit board for electrical connection to external devices. Each terminal is formed on an inner wall of a through hole on the lower circuit board substrate by plating. The inner wall is partially cut away during cutting of the printed circuit board. The remaining portion thereof becomes the terminal. Further, the upper circuit board substrate serves to seal the through holes before cutting, for preventing resin from permeating therein during injection molding.

The various objects and advantages of the present invention will be more readily understood from the following detailed description when reading in conjunction with the appended drawings.

DETAILED DESCRIPTION OF THE PREFERRED EMBODIMENTS

Figure 1:
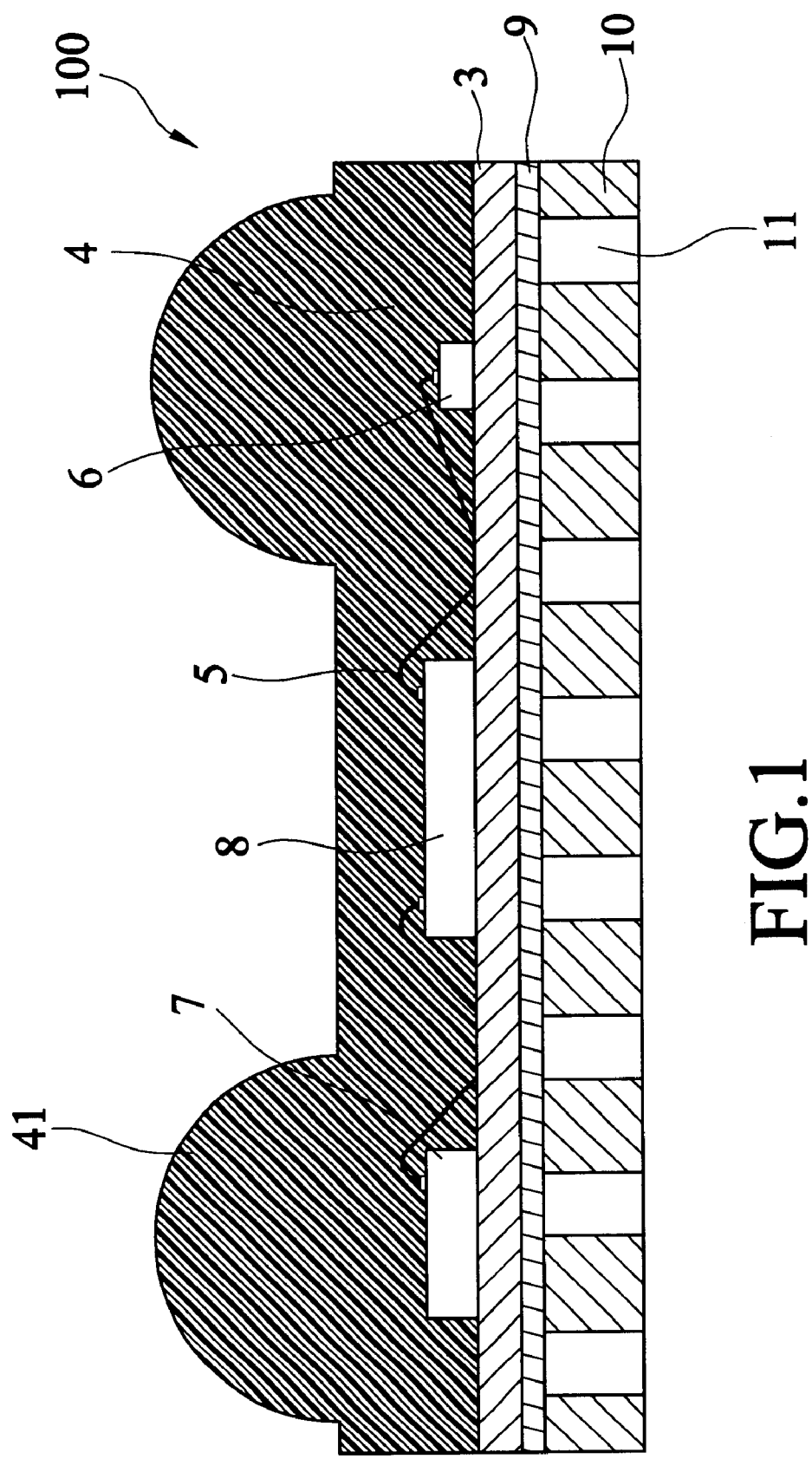
FIG. 1 is an elevation view of the first embodiment in the present invention, cross-hatched to distinguish the layers thereof.
Figure 2:
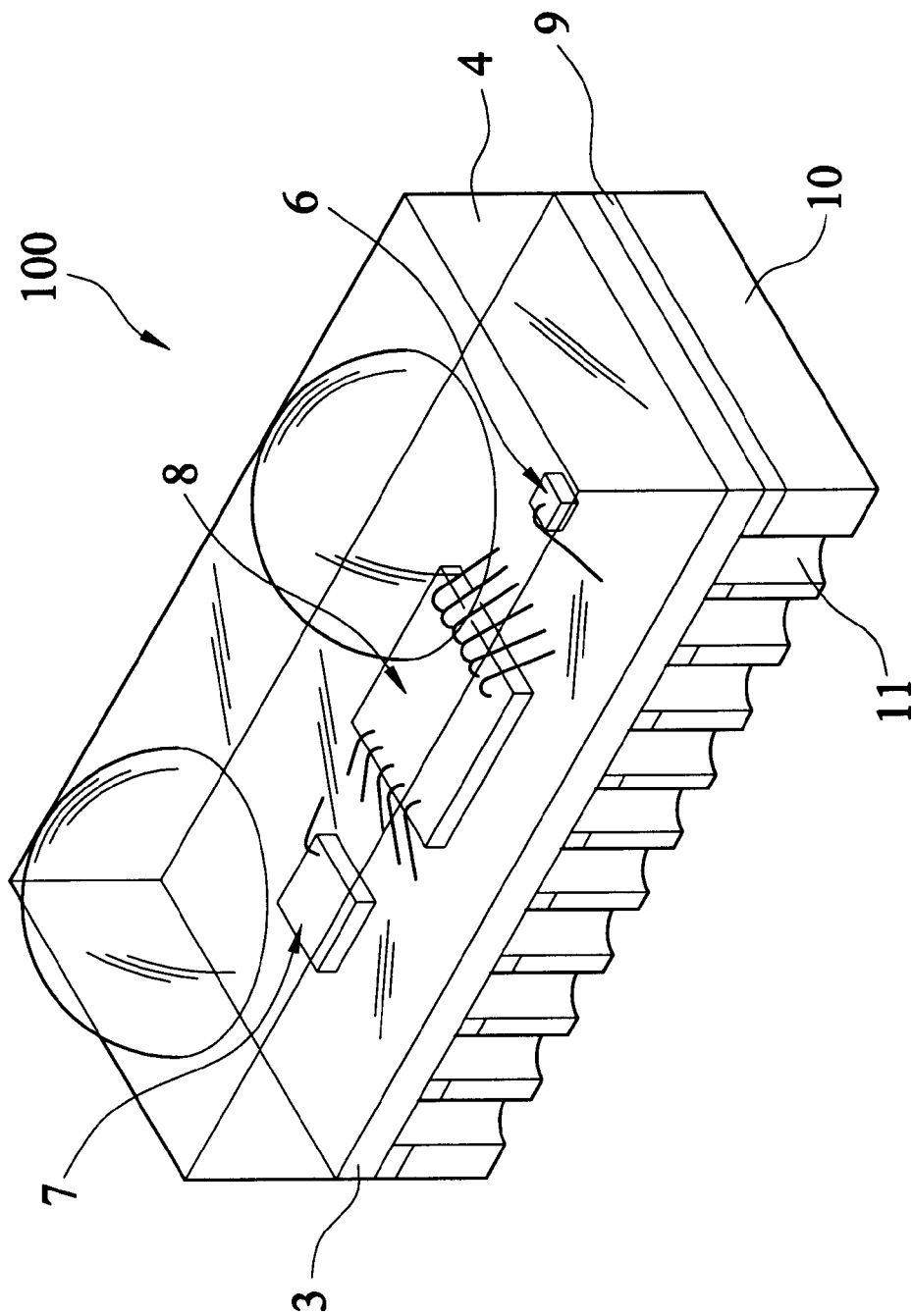
FIG. 2 is a perspective view of the first embodiment in the present invention.
Figure 3:
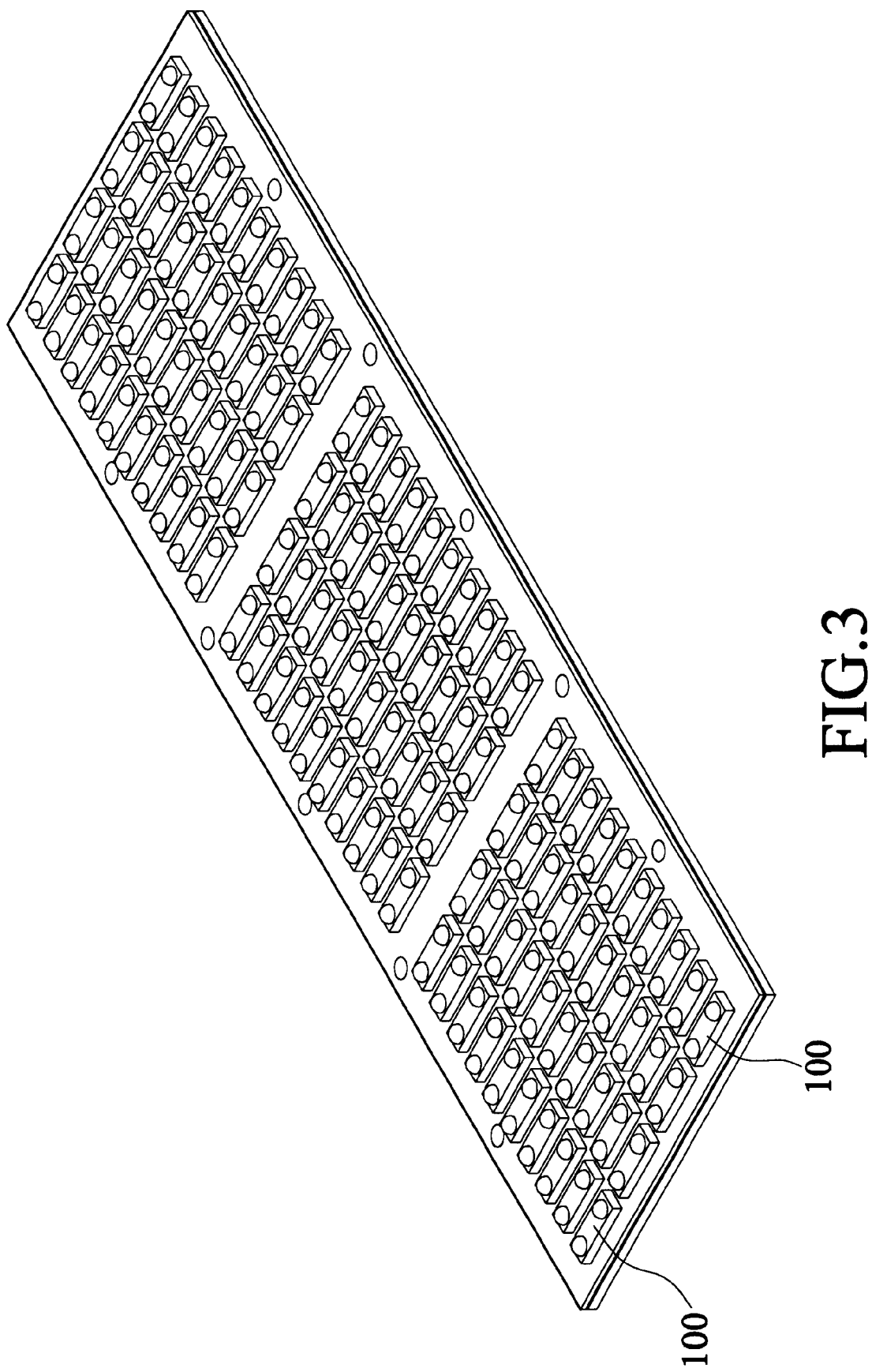
FIG. 3 is a perspective view of the first embodiment in the present invention, where modules are packaged, bu not yet cut into products.

Referring to FIGS. 1, 2 and 3, an infrared data transmission module 100 is illustrated. In FIG. 3, during the manufacturing process of the present invention, a plurality of infrared data transmission modules 100 are formed on a multiple layer printed circuit board subsequently cut into individual product. FIG. 2 is a perspective view of the product according to the present invention. FIG. 1 is an elevation view of the product of the present invention. It should be noted that the cross-hatching in FIG. 1 is used to distinguish the different layers.

In the manufacturing process of the present invention, a plurality of through holes are installed in the whole lower circuit board 10. The inner wall of each through hole 11 is plated with a metal as a terminal for electrical connection and the terminal is caused to be electrically connected to the circuit of the lower circuit board 10. Then, an upper circuit board 3 is adhered to the lower circuit board 10 by a bonding element (for example, glue). The through holes 10 are sealed by the upper circuit board 3. Then, the circuit of the upper circuit board 3 is electrically connected to the circuit of the lower circuit board 10 to form a multiple layer circuit board. Next, a light emitter 6 (for example, a light emitting diode), a photo detector 7, and a control integrated circuit (IC) 8 are respectively firmly secured at proper positions on the upper circuit board 3. Furthermore, the light emitter 6, photo detector 7 and control integrated circuit 8 are connected to the upper circuit board 3 by conducive wires 5. Then, by injection molding or transfer molding of a transparent resin package layer 4 (for example, transparent epoxy), these elements are packaged to the upper circuit board 3. Each of the upper sides of the light emitter 6 and photo detector 7 is formed with a protruded cambered surface 41 for focusing light. The result, as shown in FIG. 3, is a plurality of infrared data transmission modules 100 formed on the whole multiple layer circuit board.

Finally, the whole multiple layer circuit board is cut into many infrared data transmission modules 100. The through holes 11 in the lower circuit board 10 are cut longitudinally and a portion of an inner wall of each through hole 11 is removed. The remaining portion of the inner wall of each through hole which has been plated with metal defines a terminal. In use, when an electric signal for light emission is input from a through hole 11 to the infrared data transmission module 100, the control integrated circuit 8 will respond to that electric signal to control the light emitter 6 to emit light that is directed out through convex cambered surface 41. When an infrared ray with a proper wavelength enters into the infrared data transmission module 100, it is at first focused in the protruded cambered surface 41 and then is directed to the photo detector 7. Then, the photo detector 7 will emit a corresponding electric signal to the control integrated circuit 8, that in turn emits a respective electric signal to the terminals of the through holes for output.

Figure 4:
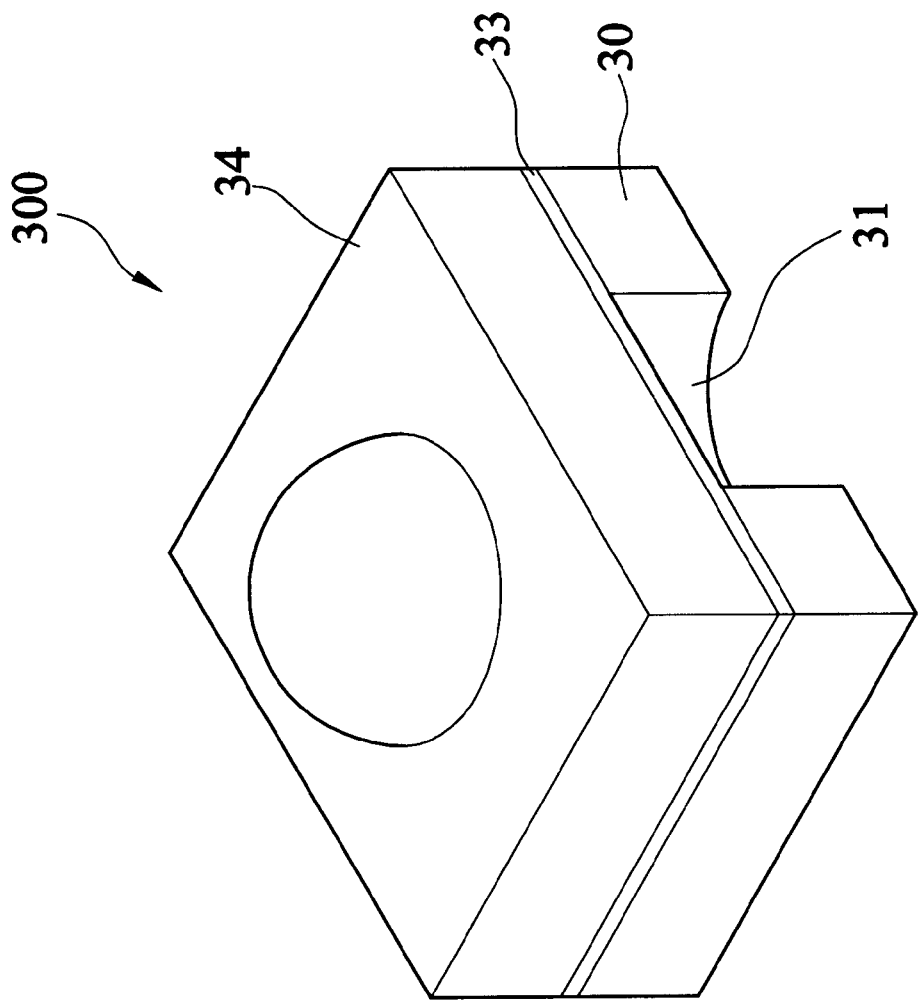
FIG. 4 is a perspective view of the second embodiment in the present invention.
Figure 7:
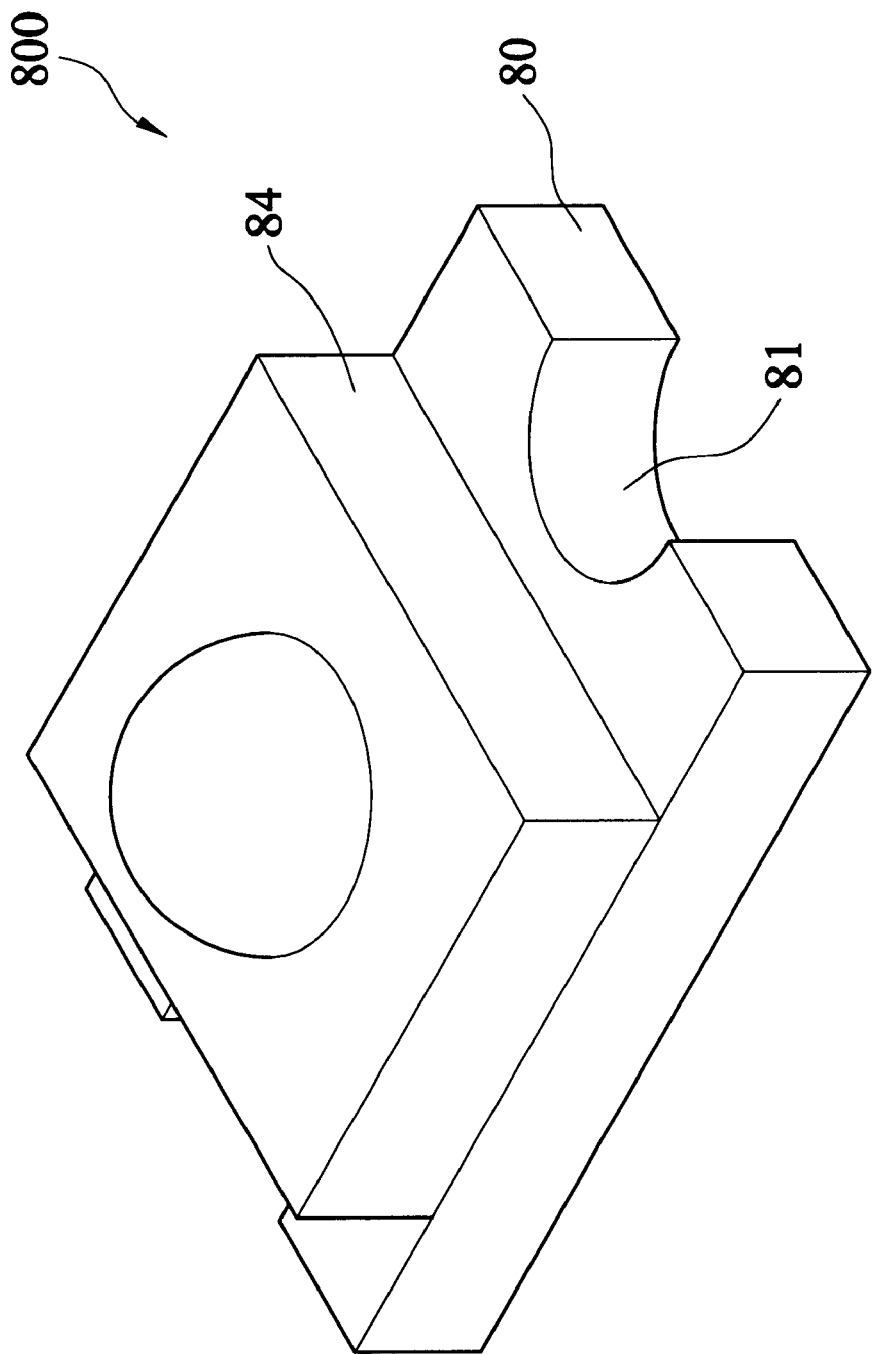
FIG. 7 shows a prior art chip light emitting diode.

Referring to FIG. 4, the second embodiment of the present invention is illustrated, which is an LED chip (light emitting diode) 300. In the manufacturing process, it is made from a whole circuit board. A plurality of through holes 31 are drilled in the lower circuit board 30 and then the lower circuit board is adhered to the upper circuit board 33 to form a multiple layer circuit board. Of course, plating the inner wall of the through holes 31 as terminals is also included in the process. A plurality of LED chips (not shown), which are the photoelectric elements of this embodiment, are bonded on the multiple layer circuit board. After the whole circuit board with light emitting diode chips is covered with a packaging layer 34, by injection molding, a product shown in FIG. 4 can be formed by cutting the circuit board. The through holes 31 which are partially cut away along the vertical direction relative to the circuit board serve as terminals. In use, when the terminals of the through holes 31 are electrically connected to a power source, the light emitting diode therein will emit light, and the light is radiated through the packaging layer 34. Therefore, a light emitter is formed. In the present invention, since the upper circuit board 3 seals the through holes 31, during injection molding no resin will fill into the through holes 31. Therefore, the through holes 31 may be formed below the packaging layer 34. Consequently, the volume of the light emitting diode chip 300 is greatly reduced. Whereas, in the prior art chip light emitting diode 800 shown in FIG. 7, the lower circuit board 80 must protrude out transversely, otherwise the resin in the package layer 84 would permeate into the welding hole 81. Therefore, the device requires a larger volume.

Figure 5:
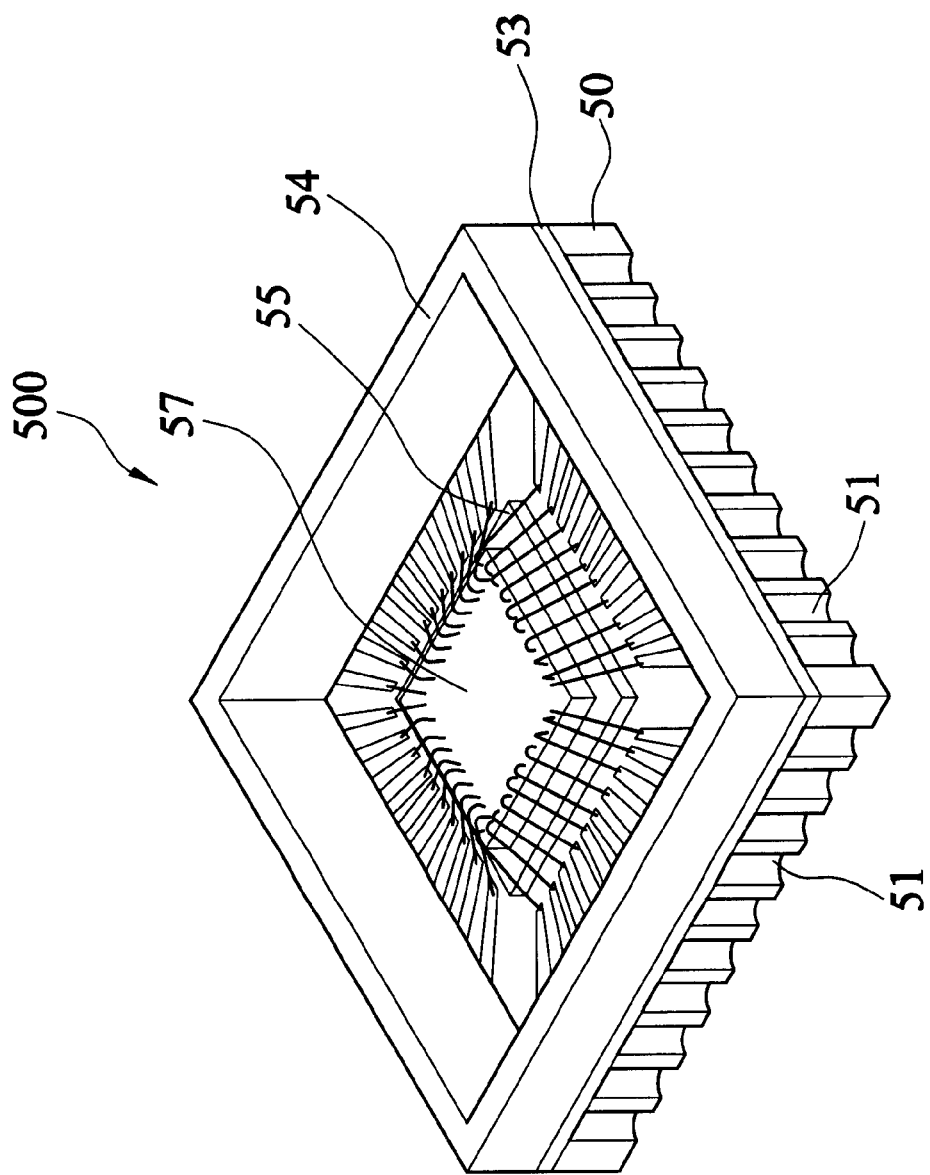
FIG. 5 is a perspective view of the third embodiment in the present invention.
Figure 6:
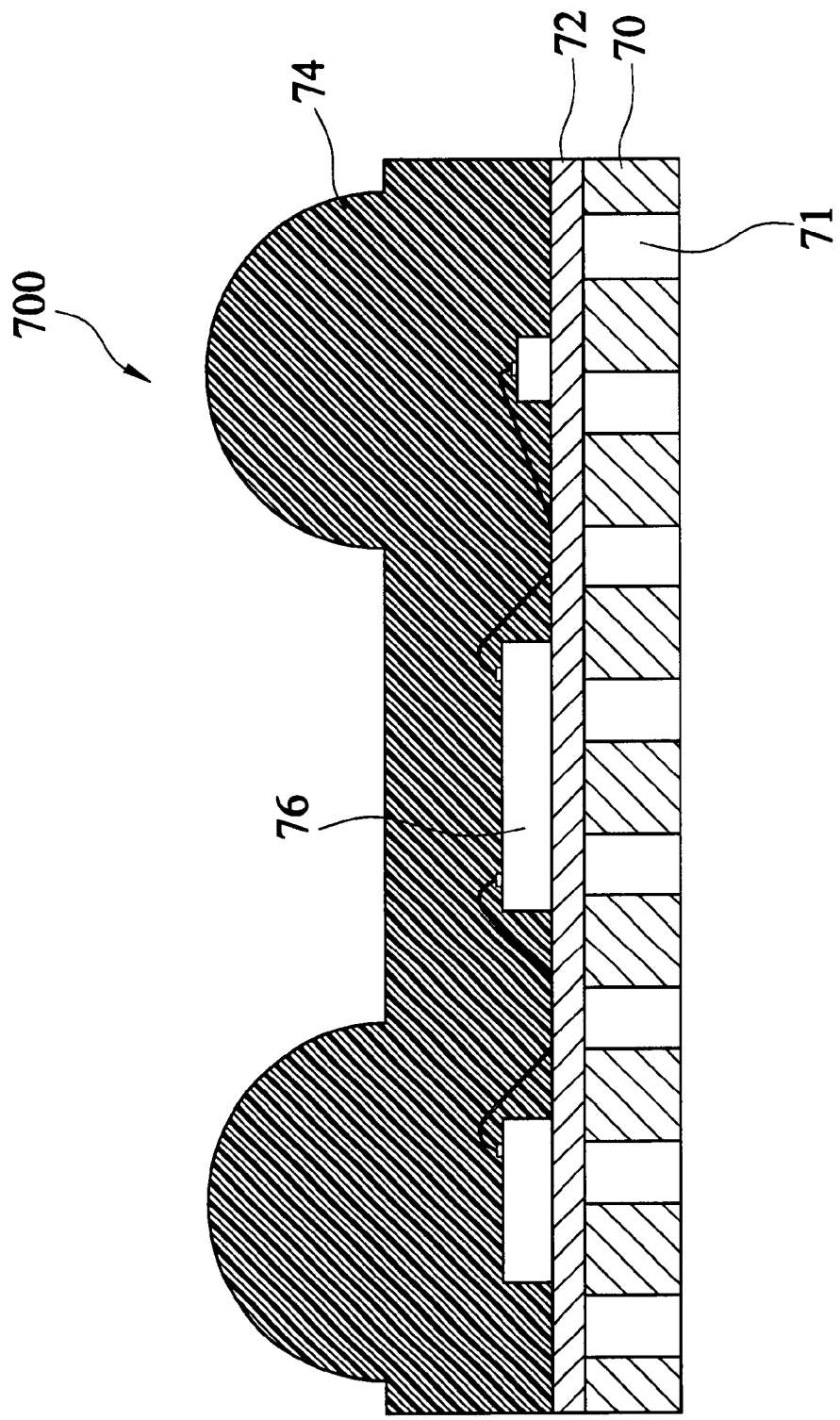
FIG. 6 is an elevation view of the prior art infrared data transmission module, cross-hatched to distinguish the layers thereof.
Figure 8:
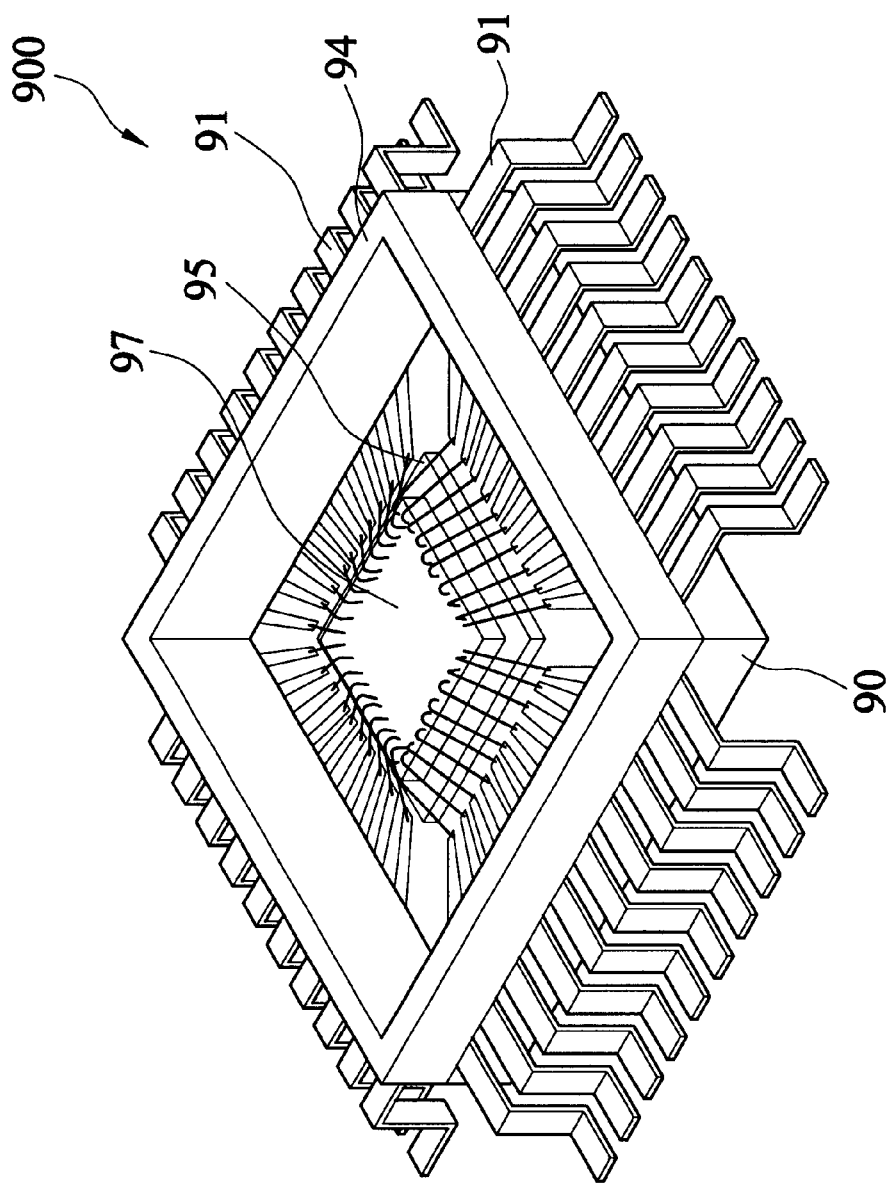
FIG. 8 shows a perspective view of a charge coupled device.

Referring to FIG. 5, the third embodiment of the present invention is illustrated. A charge coupled device (CCD) 500 is shown. The current trend for this product is for the device to be as small as possible. In the manufacturing process, it is made from a whole circuit board. A plurality of through holes 51 are drilled in the lower circuit board 50 and then the lower circuit board is adhered to the upper circuit board 53, to form a multiple layer circuit board. The inner wall of the through holes 51 are plated during the process to form terminals. A plurality of charge coupled device chips 57 which are the photoelectric elements, are bonded on the multiple layer circuit board. After the whole circuit board with a plurality of charge coupled device chips are packaged with a transparent package layer 54, by injection molding, the product shown in FIG. 5 can be formed by cutting the circuit board. The through holes 51 are partially cut away along the vertical direction relative to the circuit board and then serve as terminals. In use, when light radiates on the charge coupled device chip 57, the respective electric signals pass through conductive wires 55 and are output from the terminals of through holes 51. In the present invention, since the upper circuit board 53 seals the lower circuit board 50, during injection molding, no resin will permeate into the through holes 51. Therefore, the terminals of the through holes 51 are formed below the package layer 54. Consequently, the volume of the charge coupled device (CCD) 500 is greatly reduced. Whereas, in the prior art CCD 900 shown in FIG. 8, the terminals 91 must protrude out transversely. Therefore, the device requires a larger volume.

Although the present invention has been described with reference to the preferred embodiments, it will be understood that the invention is not limited to the details described thereof. Various substitutions and modification shave been suggested in the foregoing description, and others will occur to those of ordinary skill in the art. therefore, all such substitutions and modifications are intended to be embraced within the scope of the invention as defined in the appended claims.

What is claimed is:

1. A photoelectric module device comprising:
   a multiple layer printed circuit board having at least an upper circuit board substrate, a lower circuit board substrate, and a circuit;
   at least one photoelectric element installed on the multiple layer printed circuit board and electrically connected to the circuit;
   a transparent resin injection molded onto the photoelectric element on the multiple layer printed circuit board to form a package therefore;
   the photoelectric module device characterized in that: a lateral surface of the lower circuit board substrate has a plurality of terminals electrically connected to the circuit for electrical connection to external devices; wherein each of the terminals is formed on a residual portion of an inner wall of a through hole formed on the lower circuit board substrate after a portion of said inner wall is cut away and said upper circuit board substrate serves to seal the through holes for preventing said resin from permeating therein in said injection molding.

2. The photoelectric module device as claimed in claim 1, wherein the photoelectric module device includes at least one light emitter and at least one light receiving element.

3. The photoelectric module device as claimed in claim 1, wherein the photoelectric module device includes at least one light emitter.

4. The photoelectric module device as claimed in claim 3, wherein the light emitter is at least one light emitting diode chip.

5. The photoelectric module device as claimed in claim 1, wherein the photoelectric module device includes at least one light receiving element.

6. The photoelectric module device as claimed in claim 5, wherein the light receiving element is at least one charge coupled device chip.

* * * * *